United States Patent
Fernandez-Texon

(10) Patent No.: US 6,483,387 B1
(45) Date of Patent: Nov. 19, 2002

(54) VOLTAGE-CONTROLLED OSCILLATOR FREQUENCY RANGE DETECTOR

(75) Inventor: Francisco Fernandez-Texon, San Jose, CA (US)

(73) Assignee: Micrel, Incorporated, San Jose, CA (US)

(*) Notice: Subject to any disclaimer, the term of this patent is extended or adjusted under 35 U.S.C. 154(b) by 0 days.

(21) Appl. No.: 09/951,302

(22) Filed: Sep. 10, 2001

(51) Int. Cl.$^7$ ................................................. H03L 7/00
(52) U.S. Cl. ..................... 331/17; 331/1 A; 331/177 R; 331/11
(58) Field of Search ................. 331/1 A, 1 R, 331/11, 16, 17, 10, 34, 175, 177 R

(56) References Cited

U.S. PATENT DOCUMENTS

| | | | | |
|---|---|---|---|---|
| 5,119,391 A | * | 6/1992 | Maeda et al. | 372/20 |
| 6,002,302 A | * | 12/1999 | Pang | 327/157 |
| 6,060,953 A | * | 5/2000 | Tsai | 331/1 A |
| 6,366,769 B1 | * | 4/2002 | Vaucher et al. | 455/183.1 |

* cited by examiner

Primary Examiner—Terry D. Cunningham
Assistant Examiner—Quan Tra
(74) Attorney, Agent, or Firm—MacPherson Kwok Chen & Heid LLP

(57) ABSTRACT

A voltage-controlled oscillator frequency range detector is disclosed that detects when the voltage-controlled oscillator frequency within a phase-locked loop is out of range and indicates the required direction of the frequency adjustment. The voltage-controlled oscillator frequency range detector includes a comparator circuit, which receives a voltage-controlled oscillator control voltage signal, and a frequency detector circuit, which receives a reference clock signal and a voltage-controlled oscillator clock signal. Decision logic circuitry, coupled to the comparator circuit and to the frequency detector circuit, receives at least one output from the comparator circuit and an output from the frequency detector circuit and indicates whether an adjustment to a voltage-controlled oscillator frequency is required and its direction.

10 Claims, 2 Drawing Sheets

VOLTAGE-CONTROLLED OSCILLATOR FREQUENCY RANGE DETECTOR

BACKGROUND OF THE INVENTION

1. Field of the Invention

The present invention relates generally to electrical circuits and, more particularly, to voltage-controlled oscillators.

2. Related Art

Frequency synthesizers, such as a multi-rate fractional-N frequency synthesizer, are well known. In a typical frequency synthesizer (e.g., a phase-locked loop), a frequency adjustment is required when the maximum or minimum frequency of the voltage-controlled oscillator (VCO) is not sufficient to synthesize the desired frequency. A common technique is to adjust the center frequency of the VCO by laser trimming certain circuit elements, such as a capacitor or a resistor, that control the VCO frequency to adjust the VCO center frequency to within its frequency-capture range.

One drawback of physical trimming is that the range of frequencies is permanently limited. For example, in a fractional-N synthesizer, which is capable of synthesizing hundreds of frequencies (e.g., each selected by a set of programmed bits), physical trimming permanently constrains the range of frequencies that can be synthesized to less than what could possibly be generated by the synthesizer. Furthermore, physical trimming incurs additional cost and time because the VCO frequency for each synthesizer must be measured and trimmed as necessary.

BRIEF SUMMARY OF THE INVENTION

A VCO frequency range detector is disclosed herein. The VCO frequency range detector detects when the VCO frequency is out of range and indicates the required direction of the frequency adjustment. The VCO frequency range detector may be used, for example, as part of a VCO frequency-trimming block in a multi-rate fractional-N frequency synthesizer. Physical trimming is thus eliminated by introducing on-chip trimming circuitry that adjusts the VCO frequency when it is out of range by executing adjustments based on the signals received from the VCO frequency range detector.

In accordance with one embodiment of the present invention, a voltage-controlled oscillator frequency range detector includes a comparator circuit, which receives a voltage-controlled oscillator control voltage signal and provides at least one output signal based on a comparison of the voltage-controlled oscillator control voltage signal to a maximum or minimum voltage level, and a frequency detector circuit, which receives a reference clock signal and a voltage-controlled oscillator clock signal and provides an output signal indicating which is at a greater frequency. The voltage-controlled oscillator frequency range detector further includes a decision logic circuit coupled to the comparator circuit and to the frequency detector circuit. The decision logic circuit receives at least one output signal from the comparator circuit and the output signal from the frequency detector circuit and indicates whether a frequency adjustment to a voltage-controlled oscillator is required.

In accordance with another embodiment of the present invention, a method of detecting when a frequency of a voltage-controlled oscillator within a phase-locked loop is out of range includes receiving a voltage-controlled oscillator control voltage; comparing the voltage-controlled oscillator control voltage to a maximum voltage level and a minimum voltage level and providing a first result; receiving a reference clock signal and a voltage-controlled oscillator clock signal; comparing the reference clock signal to the voltage-controlled oscillator clock signal and providing a second result; and determining whether the frequency of the voltage-controlled oscillator is out of range based on the first result and the second result.

A more complete understanding of embodiments of the present invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

The preferred embodiments of the present invention and their advantages are best understood by referring to the detailed description that follows. It should be appreciated that like reference numerals are used to identify like elements illustrated in one or more of the figures.

DETAILED DESCRIPTION OF THE INVENTION

Figure 1:
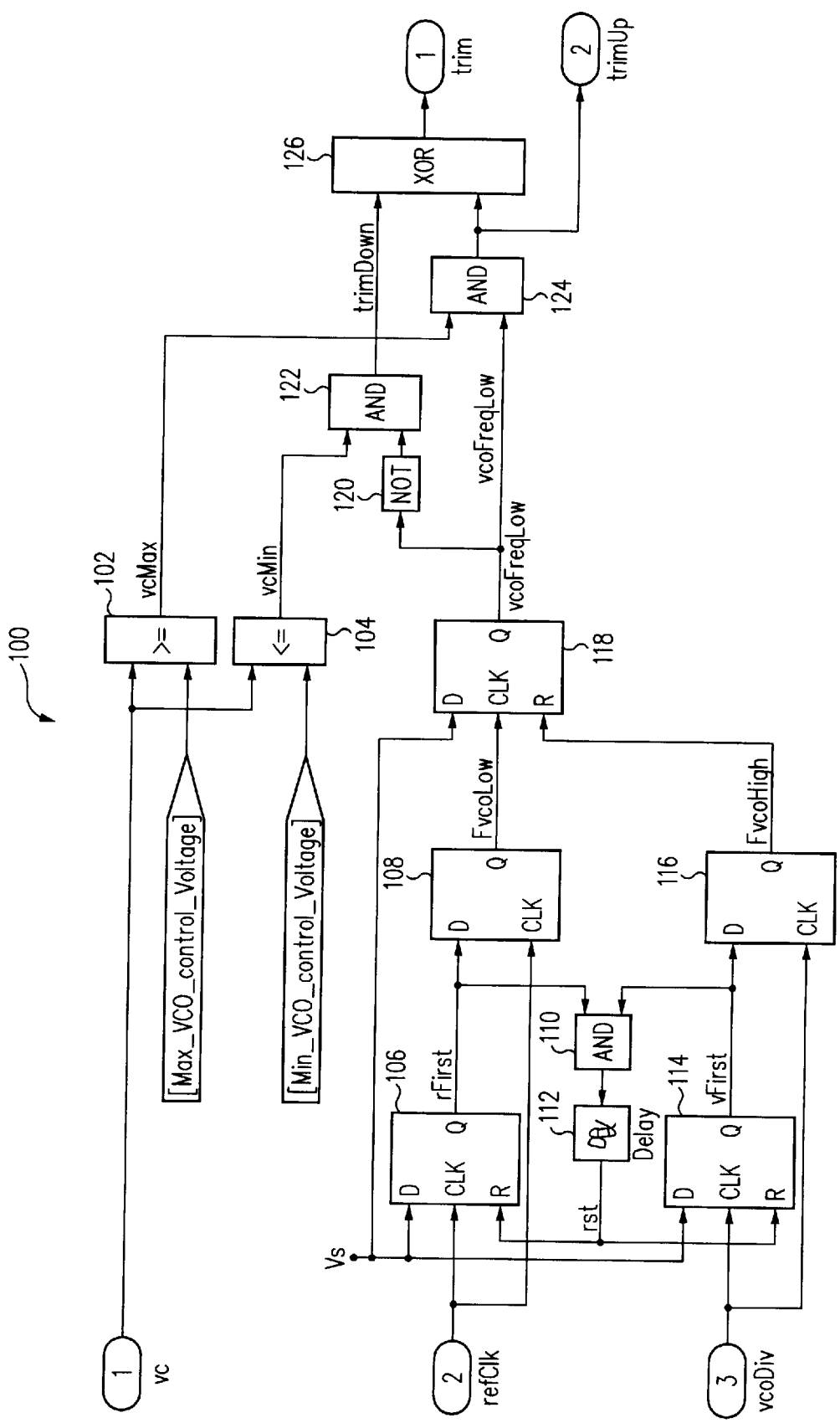
FIG. 1 shows a block diagram illustrating an exemplary voltage-controlled oscillator frequency range detector in accordance with an embodiment of the present invention.

FIG. 1 shows a block diagram illustrating an exemplary VCO frequency range detector 100 in accordance with an embodiment of the present invention. VCO frequency range detector 100 includes comparators 102 and 104, flip-flops 106, 108, 114, 116, and 118, logic gates 110, 120, 122, 124, and 126, and a delay element 112.

Comparator 102 compares a VCO control voltage (vc) to a maximum allowed control voltage (Max_$_{VCO}$_control_Voltage) and provides output signal vcMax based on the comparison. For example, output signal vcMax is true if VCO control voltage (vc) is greater than or equal to the maximum allowed control voltage. VCO control voltage (vc) corresponds to a control voltage (e.g., fine control) of a VCO, such as within a phase-locked loop, that is being monitored by VCO frequency range detector 100.

Comparator 104 compares VCO control voltage (vc) to a minimum allowed control voltage (Min_VCO_control_Voltage) and provides output signal vcMin based on the comparison. For example, output signal vcmin is true if VCO control voltage (vc) is less than or equal to the minimum allowed control voltage.

Flip-flops 106, 108, 114, 116, and 118 form a frequency detector. Flip-flops 106 and 114 receive at their D input terminal a logical high signal value (Vs) and receive at their reset (R) input terminal an output signal (rst) from delay element 112. Delay element 112 is optional and can be a pair of inverters or one or more buffers that introduce a delay that is equal to at least the rise time of the Q output signals of flip-flops 106 and 114. A reference clock (refClk) signal is received at a clock (CLK) input terminal of flip-flops 106 and 108. Reference clock (refClk) signal, for example, is a frequency synthesizer reference clock, which is an input to the phase-lock loop phase detector (described in further detail herein). A VCO clock (vcoDiv) signal is received at a clock (CLK) input terminal of flip-flops 114 and 116. VCO clock (vcoDiv) signal, for example, is a clock signal of the VCO that is reduced or divided to a lower clock rate and is the other input to the phase-lock loop phase detector. Reference clock (refClk) signal and VCO clock (vcoDiv) signal are the input signals to the phase detector of the frequency synthesizer (not shown).

Flip-flops 106 and 114 along with logic gate 110 and delay element 112 are coupled to function as a phase detector. Logic gate 110 is an AND gate and receives the Q output signals from flip-flops 106 and 114, labeled rFirst and vFirst, respectively. The Q output signals, rFirst and vFirst, correspond to pump up and pump down (i.e., increase or decrease frequency), respectively, in a phase detector. Delay element 112 receives an output signal from logic gate 110 and provides output signal (rst).

For the frequency detector operation, if the frequency of reference clock (refclk) signal is greater than that of VCO clock (vcoDiv) signal, there will be a pulse at Q output signal (rFirst) of flip-flop 106 that will become greater after every period of reference clock (refClk) signal. This represents the phase accumulation due to the frequency difference between reference clock (refClk) signal and VCO clock (vcoDiv) signal. Eventually, the pulse width at Q output signal (rFirst) of flip-flop 106 will exceed one period of reference clock (refClk) signal, resulting in flip-flop 108 providing a train of pulses for a Q output signal (FvcoLow) of flip-flop 108. The train of pulses from flip-flop 108 indicates that the frequency of VCO clock (vcoDiv) signal is lower than the frequency of reference clock (refClk) signal.

In a similar fashion, if the frequency of VCO clock (vcoDiv) signal is greater than reference clock (refClk) signal, there will be a pulse at Q output signal (vfirst) of flip-flop 114 that will become greater after every period of VCO clock (vcoDiv) signal. Eventually, the pulse width at Q output signal (vFirst) of flip-flop 114 will exceed one period of VCO clock (vcoDiv) signal, resulting in flip-flop 116 providing a train of pulses for a Q output signal (FvcoHigh) of flip-flop 116. The train of pulses from flip-flop 116 indicates that the frequency of VCO clock (vcodiv) signal is higher than the frequency of reference clock (refClk) signal.

The train of pulses only exists from the output of either flip-flop 108 or flip-flop 116, never from both flip-flops 108 and 116 simultaneously. Flip-flop 118 receives logical high signal value (Vs) at its D input terminal, Q output signal (FvcoLow) from flip-flop 108 at its clock (CLK) input terminal, and Q output signal (FvcoHigh) from flip-flop 116 at its reset (R) input terminal. Consequently, flip-flop 118 provides a Q output signal (vcoFreqLow) that is true (i.e., a logical high) if a low-to-high signal transition is received at its clock input terminal, and is false (i.e., a logical low) if the train of pulses (i.e., Q output signal (FvcoHigh) is asserted) is received at its reset input terminal. Thus, Q output signal (vcoFreqLow) is true if the frequency of VCO clock (vcoDiv) signal is lower than the frequency of reference clock (refClk) signal, and false otherwise.

Logic gates 120, 122, 124, and 126 provide the decision logic for the signals output signal vcMax from comparator 102, output signal vcMin from comparator 104, and Q output signal (vcoFreqLow) from flip-flop 118. As shown in FIG. 1, logic gate 120 is an inverter (i.e., a NOT gate), logic gates 122 and 124 are AND gates, and logic gate 126 is an exclusive OR gate.

Logic gate 122 receives output signal vcMin from comparator 104 and Q output signal (vcoFreqLow) from flip-flop 118, which is first inverted by logic gate 120, and provides an output signal trimDown to logic gate 126. Logic gate 124 receives Q output signal (vcoFreqLow) from flip-flop 118 and output signal vcMax from comparator 102 and provides an output signal trimUp, which is also received by logic gate 126. Logic gate 126 receives output signal trimDown from logic gate 122 and output signal trimup from logic gate 124 and provides an output signal trim.

Output signal trimup indicates whether the VCO frequency has to be increased (i.e., a logical true) or decreased (i.e., a logical false). Output signal trim indicates whether a VCO frequency adjustment (i.e., a trimming) is required, with a logical true indicating that a frequency adjustment is required and a logical false indicating that no frequency adjustment is required. Table 1 summarizes the various states of VCO frequency range detector 100 and the desired action or output signal values based on the values of the input signals.

TABLE 1

Decision Logic Summary

| STATE | vcMax | vcMin | vcoFreqLow | trim | trimUp | ACTION REQUIRED |
|---|---|---|---|---|---|---|
| 1 | 0 | 0 | x | 0 | 0 | None |
| 2 | 0 | 1 | 0 | 1 | 0 | Reduce VCO frequency |
| 3 | 0 | 1 | 1 | 0 | 0 | None |
| 4 | 1 | 0 | 0 | 0 | 0 | None |
| 5 | 1 | 0 | 1 | 1 | 1 | Increase VCO frequency |
| 6 | 1 | 1 | x | | | None, Invalid State |

Figure 2:
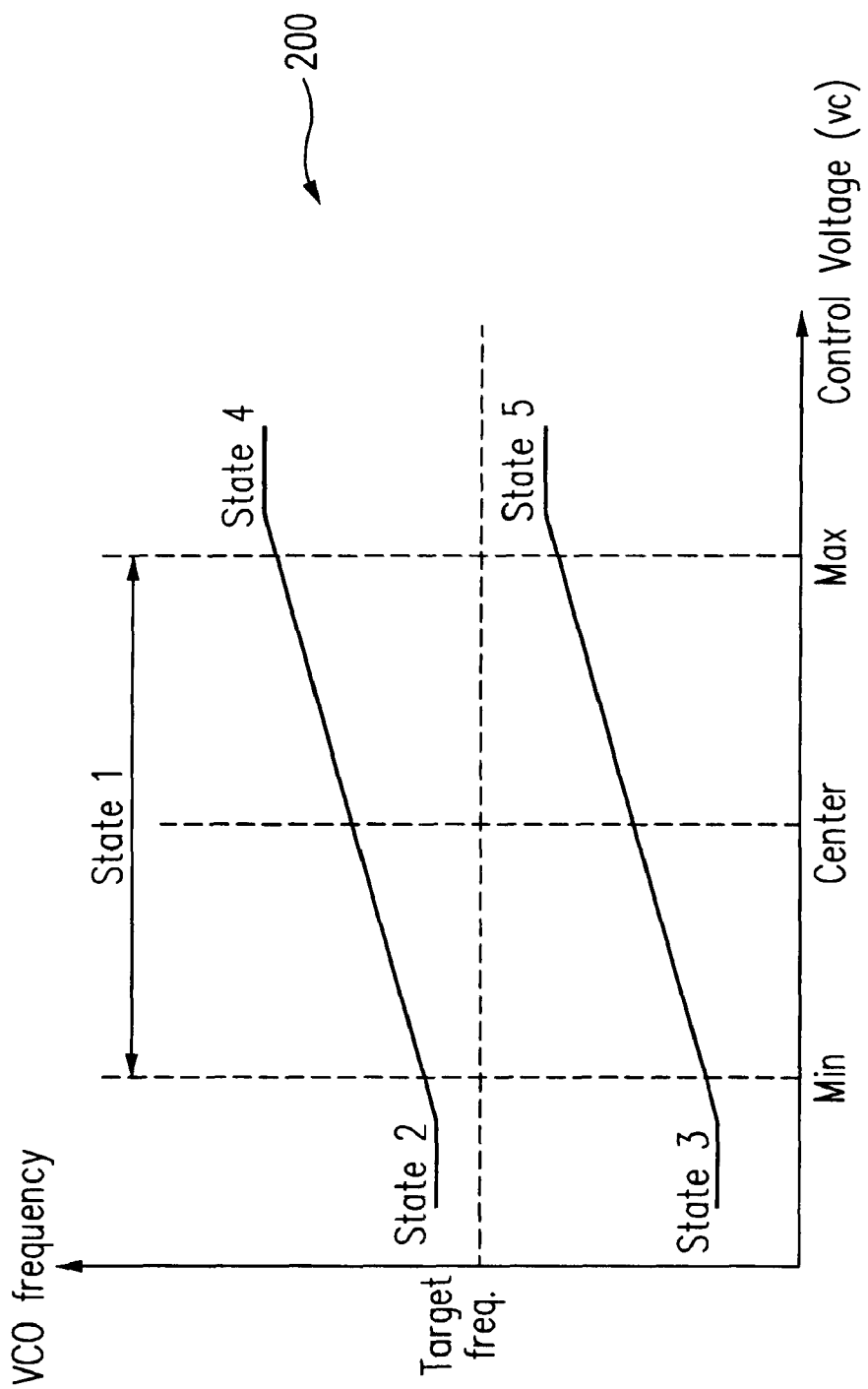
FIG. 2 shows a graph illustrating possible frequency and voltage states of the embodiment of FIG. 1.

FIG. 2 shows a graph 200 illustrating the possible states embodiment of FIG. 1. Graph 200 is a plot of VCO frequency versus VCO control voltage (vc), with exemplary plotted curves that illustrate the five possible states of the VCO frequency range detector 100 corresponding to the states summarized in Table 1.

In state 1, the VCO frequency may be at the target frequency (illustrated by the horizontal dashed line labeled Target freq. on graph 200) or greater than or less than the target frequency, indicating that the VCO (e.g., the VCO within a phase-lock loop) has not settled to its final frequency. No action is required during this state, as VCO control voltage (vc) is currently between its minimum voltage level (labeled Min on graph 200) and its maximum voltage level (labeled Max on graph 200). For state 2, the VCO control voltage (vc) has reached its minimum value and the VCO frequency is still larger than the target frequency. A VCO frequency reduction is required.

At state 3, the VCO control voltage (vc) is at its minimum value and the VCO frequency is less than the target frequency, indicating that the phase-lock loop has not settled and the VCO control voltage is still increasing. Because of the transitory state, no action is required. For state 4, the VCO control voltage (vc) is at its maximum value and the VCO frequency is larger than the target frequency, indicating that the loop has not settled and the VCO control voltage (vc) is still decreasing. Again, because of the transitory state, no action is required. For state 5, VCO control voltage (vc) has reached its maximum value and the VCO frequency is still less than the target frequency. A VCO frequency increase is required.

A VCO frequency range detector is disclosed herein. The VCO frequency range detector detects when the VCO frequency is out of range and indicates the direction of the required frequency adjustment. The voltage-controlled oscillator frequency range detector, such as the embodiment disclosed in FIG. 1, may be used as part of a voltage-controlled oscillator frequency trimming block as disclosed in U.S. patent application entitled "Voltage-Controlled Oscillator Frequency Auto-Calibrating System" [serial number unknown, attorney docket number M-11910 US], filed Sept. 10, 2001, which is incorporated herein by reference in its entirety. Physical trimming is eliminated by introducing on-chip trimming circuitry that adjusts the VCO frequency when it is out of range by executing adjustments based on the signals received from the VCO frequency range detector.

Embodiments described above illustrate but do not limit the invention. It should also be understood that numerous modifications and variations are possible in accordance with the principles of the present invention. Accordingly, the scope of the invention is defined only by the following claims.

I claim:

1. A voltage-controlled oscillator frequency range detector, comprising:

a comparator circuit, which receives a voltage-controlled oscillator control voltage signal and provides at least one output signal based on a comparison of the voltage-controlled oscillator control voltage signal to a maximum or minimum voltage level;

a frequency detector circuit which receives a reference clock signal and a voltage-controlled oscillator clock signal and provides an output signal indicating which is at a greater frequency; and a decision logic circuit coupled to the comparator circuit and to the frequency detector circuit, the decision logic circuit receiving the at least one output signal from the comparator circuit and the output signal from the frequency detector circuit and indicating whether a frequency adjustment to a voltage-controlled oscillator is required.

2. The voltage-controlled oscillator frequency range detector of claim 1, wherein the comparator circuit comprises a first comparator and a second comparator, the first comparator comparing the voltage-controlled oscillator control voltage signal to a maximum allowed control voltage and providing a first output signal, and the second comparator comparing the voltage-controlled oscillator control voltage signal to a minimum allowed control voltage and providing a second output signal.

3. The voltage-controlled oscillator frequency range detector of claim 1, wherein the frequency detector circuit comprises:

a first flip-flop and a second flip-flop, which receive the reference clock signal, the second flip-flop coupled to the first flip-flop;

a third flip-flop and a fourth flip-flop, which receive the voltage-controlled oscillator clock signal, the fourth flip-flop coupled to the third flip-flop; and a fifth flip-flop coupled to the second flip-flop and the fourth flip-flop, the fifth flip-flop providing the output signal of the frequency detector circuit.

4. The voltage-controlled oscillator frequency range detector of claim 3, wherein the frequency detector circuit further comprises a logic gate coupled to the first flip-flop and the third flip-flop, and a delay element coupled to the logic gate and to the first flip-flop and the third flip-flop.

5. The voltage-controlled oscillator frequency range detector of claim 4, wherein the logic gate, the delay element, the first flip-flop, and the third flip-flop function as a phase detector.

6. The voltage-controlled oscillator frequency range detector of claim 1, wherein the decision logic provides a first output signal indicating whether the frequency of the voltage-controlled oscillator requires adjustment, and provides a second output signal indicating whether an increase or a decrease in the frequency is required.

7. The voltage-controlled oscillator frequency range detector of claim 1, wherein the voltage-controlled oscillator frequency range detector is formed as a portion of circuitry for a frequency synthesizer.

8. A method of detecting when a frequency of a voltage-controlled oscillator within a phase-locked loop is out of range, the method comprising:

receiving a voltage-controlled oscillator control voltage;

comparing the voltage-controlled oscillator control voltage to a maximum voltage level and a minimum voltage level and providing a first result;

receiving a reference clock signal and a voltage-controlled oscillator clock signal;

comparing the reference clock signal to the voltage-controlled oscillator clock signal and providing a second result; and determining whether the frequency of the voltage-controlled oscillator is out of range based on the first result and the second result.

9. The method of claim 8, wherein the determining further comprises determining whether the frequency of the voltage-controlled oscillator needs to be increased or decreased.

10. The method of claim 9, further comprising providing at least one output signal which indicates a result of the determining to on-chip frequency adjustment circuitry.

* * * * *